(12) United States Patent
Glasscock et al.

(10) Patent No.: US 12,707,986 B2
(45) Date of Patent: Aug. 11, 2026

(54) INTEGRATED CIRCUIT HAVING A ROUTABLE LEADFRAME

(71) Applicant: TEXAS INSTRUMENTS INCORPORATED, Dallas, TX (US)

(72) Inventors: Bradley Glasscock, Forney, TX (US); Makarand Kulkarni, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 652 days.

(21) Appl. No.: 17/845,262

(22) Filed: Jun. 21, 2022

(65) Prior Publication Data

US 2023/0411170 A1 Dec. 21, 2023

(51) Int. Cl.
*H10W 70/04* (2026.01)
*H10W 70/40* (2026.01)
(Continued)

(52) U.S. Cl.
CPC ....... *H10W 70/042* (2026.01); *H10W 70/047* (2026.01); *H10W 70/479* (2026.01);
(Continued)

(58) Field of Classification Search
CPC ............. H01L 21/4828; H01L 21/4839; H01L 21/565; H01L 23/3107; H01L 23/49838; H01L 23/49861; H01L 24/11; H01L 24/16; H01L 24/48; H01L 24/73; H01L 2224/11462; H01L 2224/16245; H01L 2224/48245; H01L 2224/73257; H01L 2924/3862; H01L 23/3121; H01L 24/81; H01L 2221/68359; H01L 21/4825; H01L 21/6835; H01L 23/495; H01L 23/49582; H01L 24/85; H01L 21/4821; H01L 21/56; H01L 23/293; H01L 23/49517; H01L 23/49541; H10W 70/042; H10W 70/047; H10W 70/479; H10W 70/65; H10W 74/016; H10W 74/111; H10W 72/01235;
(Continued)

(56) References Cited

U.S. PATENT DOCUMENTS 6,232,148 B1 * 5/2001 Ma ...................... H10W 90/811 438/111
2007/0281471 A1 * 12/2007 Hurwitz .............. H05K 3/4647 438/638

(Continued)

*Primary Examiner* — William B Partridge
*Assistant Examiner* — Ilker Ozden
(74) *Attorney, Agent, or Firm* — Xiaotun Qiu; Frank D. Cimino

(57) ABSTRACT

A method of fabricating an electronic device includes depositing a metal layer having external leads on a carrier. A photoresist material layer is patterned on the leads. A dielectric layer is formed over the metal layer such that surfaces of metal pillars from the metal layer are exposed. The photoresist material layer is removed from the leads, and the dielectric layer and the metal layer are removed from the carrier. A die is attached to the first surface of the dielectric layer. The die includes contacts on a surface of the die that contacts the dielectric layer such that the contacts are aligned with and connect to the exposed surfaces of the metal pillars. A mold compound is formed over the die, the dielectric layer, the metal traces, and the metal pillars of the metal layer, but not over the leads of the metal layer.

17 Claims, 12 Drawing Sheets

(51) Int. Cl.

| | |
|---|---|
| ***H10W 70/65*** | (2026.01) |
| ***H10W 72/00*** | (2026.01) |
| ***H10W 74/01*** | (2026.01) |
| ***H10W 74/10*** | (2026.01) |
| *H10W 90/00* | (2026.01) |

(52) U.S. Cl.

CPC ......... *H10W 70/65* (2026.01); *H10W 74/016* (2026.01); *H10W 74/111* (2026.01); *H10W 72/01235* (2026.01); *H10W 72/879* (2026.01); *H10W 90/726* (2026.01); *H10W 90/756* (2026.01)

(58) Field of Classification Search

CPC ............. H10W 72/879; H10W 90/726; H10W 90/756; H10W 72/072; H10W 72/075; H10W 70/457; H10W 72/20; H10W 70/415; H10W 74/114; H10W 70/041; H10W 72/50; H10W 70/04; H10W 70/421; H10W 70/464; H10W 74/01; H10W 74/47; H10P 72/743; H10P 72/74

See application file for complete search history.

(56) References Cited

U.S. PATENT DOCUMENTS

| | | | | |
|---|---|---|---|---|
| 2013/0329386 | A1* | 12/2013 | Wang | H10W 70/457<br>205/118 |
| 2014/0091462 | A1* | 4/2014 | Chen | H10W 70/65<br>257/738 |
| 2017/0069558 | A1* | 3/2017 | Bang | H01L 23/3128 |
| 2018/0114749 | A1* | 4/2018 | Dimaano, Jr. | H01L 23/49838 |

* cited by examiner 200
202
204
204

206
208
206
250
202
204
204

220
216
210
216
202
200
210
216
216
204
204

INTEGRATED CIRCUIT HAVING A ROUTABLE LEADFRAME

TECHNICAL FIELD

The present disclosure relates to an electronic device and more specifically, to an integrated circuit (IC) that includes a routable leadframe for leaded IC packages.

BACKGROUND

Leaded integrated circuit (IC) packages are fabricated with single layer leadframes and a die disposed in a center of the leadframe that are both over molded with a molding compound in a manner that external leads of the leadframe remain exposed. As dies becomes smaller and smaller and the number of pins on the dies increase, the number and the length of bonding (lead) wires that connect the pins on the die to the leadframe both increase. The increase in the number and length of the bonding wires then becomes problematic.

One issue is wire-sweeping. Wire-sweeping occurs when the mold compound is applied. As the length of the bonding wires increases, the bonding wires become flimsy and can become easily displaced by an external force. Thus, when the mold compound is applied, the mold compound pushes the bonding wires together thereby creating contact between the wires, which in turn results in short circuits in the IC package.

Another problem is cross die bonding. Specifically, since the dies are smaller and the number of pins increase, the pins and the associated lead may not be aligned. Thus, the bonding wires have to cross over other bonding wires to make the connection between the die pin and the associated lead especially in instances where the pin and the lead are on opposite sides of the IC package. This crossing of bonding wires leads to short circuits due to contact between the crossed bonding wires.

Still yet another problem is the use of inter-lead lock tape. Inter-lead lock tape is used to secure the bonding wires in place to prevent the bonding wires from moving during fabrication as previously described. Inter-lead lock tape, however, is cost prohibitive and not all suppliers have the capability to apply the tape.

Still another issue is the result of undesirable floating leads. Since there are a number of die pins that need to be grounded, ground rings are required in IC packages with complex designs. Ground rings are formed where the bonding wires are connected to power planes. This, however, can result in undesirable floating leads again leading to short circuits.

SUMMARY

In described examples, a method includes depositing a metal layer on a carrier, where the metal layer includes metal traces, metal pillars disposed on the metal traces, and leads. A photoresist material layer is patterned on the leads of the metal layer. A dielectric layer is formed over the metal layer, where surfaces of the metal pillars are exposed from a first surface of the dielectric layer. The photoresist material layer is removed from the leads of the metal layer thereby exposing the leads, and the dielectric layer and the metal layer are removed from the carrier. A die is attached to the first surface of the dielectric layer, where the die includes contacts on a surface of the die that contacts the dielectric layer, where the contacts are aligned with and connecting with the exposed surfaces of the metal pillars. A mold compound is formed over the die, the dielectric layer, the metal traces, and the metal pillars of the metal layer, but not over the leads of the metal layer.

In another described example, a method of fabricating an integrated circuit having external leads includes providing a metal carrier, where the metal carrier has a metal carrier layer deposited on a surface of the metal carrier. A metal layer is deposited on the metal carrier layer, the metal layer comprising metal traces, metal pillars disposed on the metal traces, and leads. A photoresist material layer is patterned on the leads of the metal layer and a dielectric layer is formed over the metal layer, where surfaces of the metal pillars being exposed from a first surface of the dielectric layer. The method further includes removing the photoresist material layer from the leads of the metal layer thereby exposing the leads and removing the dielectric layer and the metal layer from the metal carrier. A die is attached to the first surface of the dielectric layer, where the die includes contacts on a surface of the die that contacts the dielectric layer, the contacts being aligned with and connecting with the exposed surfaces of the metal pillars. A mold compound is formed over the die, the dielectric layer, the metal traces, and the metal pillars of the metal layer, but not over the leads of the metal layer. The leads are formed or bent in a direction away from the die to facilitate connection to a circuit board.

In another described example, an electronic device includes a dielectric layer and a metal layer embedded in the dielectric layer, where the metal layer includes leads and exposed surfaces in a surface of the dielectric layer. A die is attached to a first surface of the dielectric layer, where the die includes exposed contacts on a surface of the die that contacts the dielectric layer, where the exposed contacts are aligned with and contact the exposed surfaces of the metal layer to form an electrical connection between the die and the metal layer. A mold compound is formed over the dielectric layer, the metal layer, and the die. The leads of the metal layer are not covered by the mold compound and extend outward away from the mold compound from at least one side of the mold compound.

DETAILED DESCRIPTION

Disclosed herein is an electronic device, more specifically, a leaded integrated circuit (IC) package and method of fabricating the leaded IC package. The leads of the IC package are fabricated using routable leadframe technology or molded interconnect substrate (MIS) technology to pattern, via electroplating, a leadframe on a substrate as opposed to pre-fabricating a leadframe and placing the pre-fabricated leadframe on the substrate. The method includes providing a metal carrier and patterning, via electroplating, a metal (e.g., copper) layer on the metal carrier. A photomask is deposited over the metal layer and patterned so that the photomask is removed except for portions around the periphery where external leads will be formed. A dielectric material (e.g., ABF) is placed, via compression molding, over the metal layer and the photomask. The dielectric is then grinded to expose traces from the metal layer and the photomask. The photomask is removed thereby exposing external leads.

Routable leadframe technology can be used to fabricate any type of leaded IC package (e.g., SIP, DIP, PLCC, etc.). The routable leadframe technology enables leadframes to have fine metal trace spacing that facilitates in the reduction of the maximum bonding wire length that is unachievable using standard leadframe technology. In addition, the routable leadframe technology eliminates the need for jumper wires (die-pad to die-pad bonds) since the metal layer and external leads can be electroplated on the substrate. Still further, routable leadframe technology eliminates the issues associated with wire-sweeping and cross die bonding, both of which cause short circuiting between bonding wires, and eliminates the need for inter-lead locking tape, as explained above. The routable leadframe technology facilities the creation of ground and power planes while eliminating the floating leads and also reduce the IC package size since there would be a reduction in the number of dedicated leads to power and ground. Still further, more functionality in a given IC package size by creating more IO's.

Figure 1A:
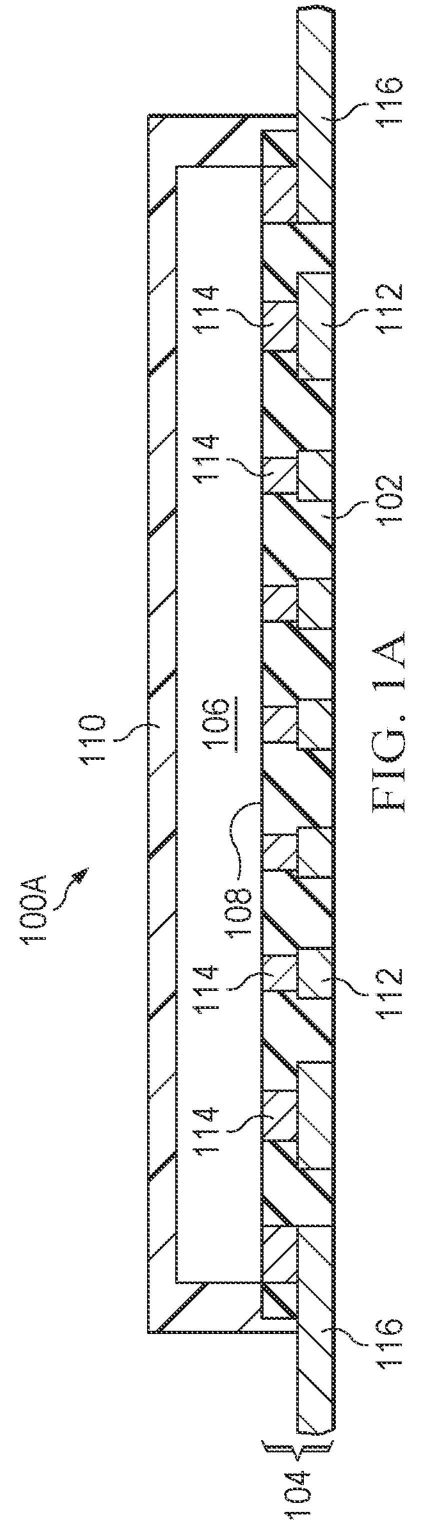
FIG. 1A is a side view of an example electronic device.

FIG. 1A is a side view of an example electronic device (e.g., integrated circuit (IC) package) 100A comprised of a substrate 102, a metal (e.g., copper) layer 104 disposed in the substrate 102, and a die 106 attached to a first (top) surface 108 of the substrate 102. A mold compound 110 covers all but one surface of the substrate 102, the one surface not covered facing away from the electronic device 100A, the metal layer 104 except for external leads, and the die 106. The electronic device 100A can be comprised of a leaded IC package including, but not limited to a SIP, DIP, PLCC, etc.

The substrate 102 is comprised of a polymer dielectric material (e.g., ABF). The metal layer 104 is fabricated via a routable leadframe technology that is deposited on a carrier (e.g., metal, plastic) via an electroplating process. The metal layer 104 is comprised of metal traces 112 and metal pillars 114 that are deposited on the metal traces 112 both of which are deposited via an electroplating process. The metal pillars 114 extend from the metal traces 112 toward the first surface 108 of the substrate 102 such that surfaces of the metal pillars 114 are exposed from the first surface 108 of the substrate 102. The exposed surfaces of the metal pillars 114 are aligned with and connected to pins on a bottom surface of the die 106 to provide an electrical connection between the die 106 and the metal layer 104. The metal layer 104 is further comprised of external leads 116 that project out of one, two, three, or all four sides of the mold compound 110. The external leads 116 are fabricated using the routable leadframe technology as part of the metal traces 112, but are not encapsulated by the mold compound 110. In addition, the external leads 116 can be formed or shaped to bend in a direction away from the die 106 that facilitates an electrical connection to a circuit board (e.g., printed circuit board (PCB)).

Figure 1B:
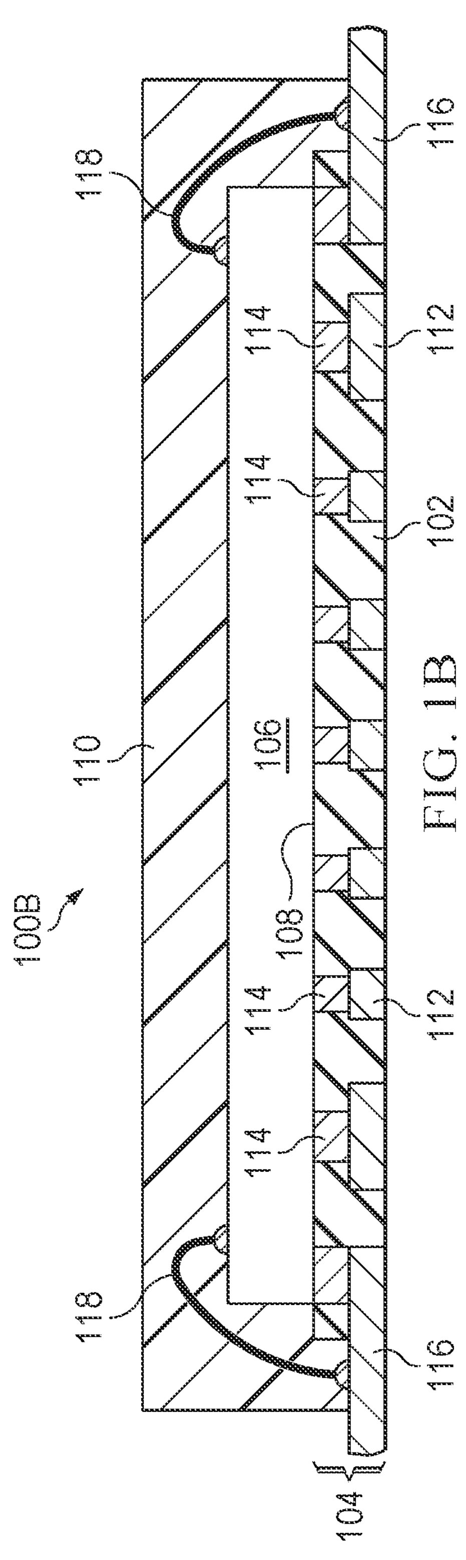
FIG. 1B is a side view of another example electronic device.

Referring to FIG. 1B, in an alternative embodiment of the electronic device 100B bonding wires 118 can be added to connect additional pins from a top surface of the die 106 to the metal traces 112 and/or the external leads 116 to provide additional connections between the die 106 and the metal layer 104. In addition, additional metal layers may be formed on the metal layer 104 based on the application of the electronic device 100A, 100B. Thus, the metal layer 104 would be a first metal layer 104 and any additional metal layers would be a second, a third, etc. metal layer.

FIGS. 2-16 illustrate a fabrication process 200 associated with the formation of the leaded electronic device 100 illustrated in FIG. 1A. Though depicted sequentially as a matter of convenience, at least some of the actions shown can be performed in a different order and/or performed in parallel. Alternatively, some implementations may perform only some of the actions shown. Still further, although the example illustrated in FIGS. 2-16 is an example method illustrating the example configuration of FIG. 1A, other methods and configurations are possible. It is understood that although the method illustrated in FIGS. 2-16 depicts the fabrication process of a single IC package, the process applies to an array of IC packages. Thus, after fabrication of the IC packages the array is singulated to separate the IC packages from the array.

Figures 2, 3:
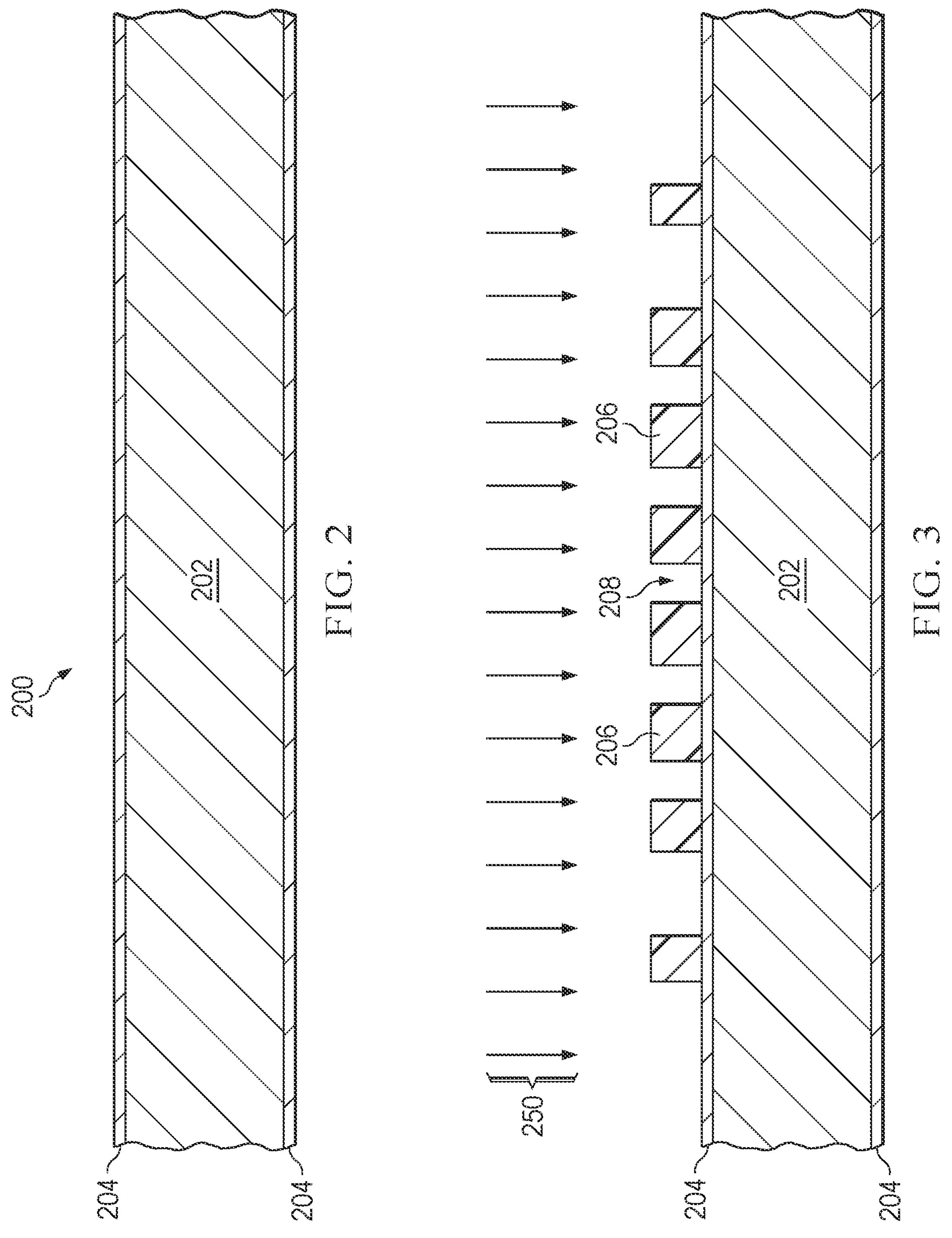
FIG. 2 illustrates a side view of a metal carrier in the early stages of fabrication of an electronic device of FIG. 1A or 1B.
FIG. 3 illustrates a side view of the electronic device of FIG. 2 undergoing a first photoresist material layer patterning.
Figures 4, 5:
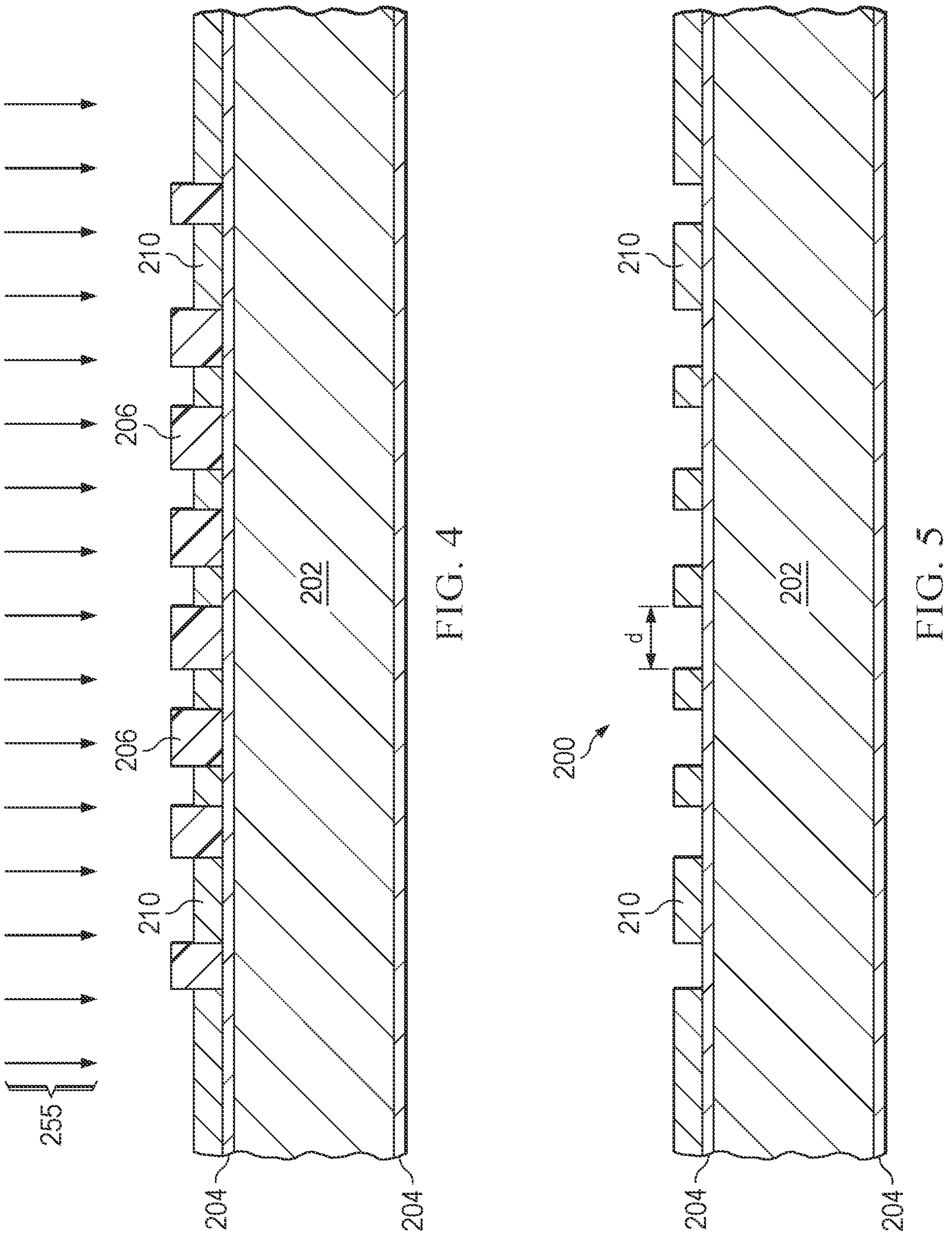
FIG. 4 illustrates a side view of the electronic device of FIG. 3 undergoing an electroplating process.
FIG. 5 illustrates a side view of the electronic device of FIG. 4 after undergoing an etch process and stripping of the first photoresist material layer.

Referring to FIG. 2, the fabricating process 200 begins with a metal carrier (e.g., stainless steel) 202. A metal carrier layer 204 comprised of a second metal (e.g., copper) can be deposited on one or both surfaces (e.g., top and bottom) of the metal carrier 202. Referring to FIG. 3, a first photoresist material layer 206 overlies the metal carrier layer 204 and is patterned and developed to expose first openings 208 in the photoresist material layer 206 in accordance with a pattern. The first photoresist material layer 206 can have a thickness that varies in correspondence with the wavelength of radiation used to pattern the first photoresist material layer 206. The first photoresist material layer 206 may be formed over the metal carrier layer 204 via spin-coating or spin casting deposition techniques, selectively irradiated (e.g., via deep ultraviolet (DUV) irradiation) and developed to form the first openings 208. Metal traces (e.g., copper) 210 are deposited in the first openings 208 via a first electroplating process 250 on the metal carrier layer 204 resulting in the configuration in FIG. 4. The remaining first photoresist material layer 206 is stripped via a first etching process 255 resulting in the configuration in FIG. 5. In the configuration in FIG. 5, a distance d between the metal traces 210 can range from 20-250 microns. In higher voltage (e.g., greater than 100 volts) configurations the distance d between the metal traces 210 can exceed 500 microns.

Figure 6:
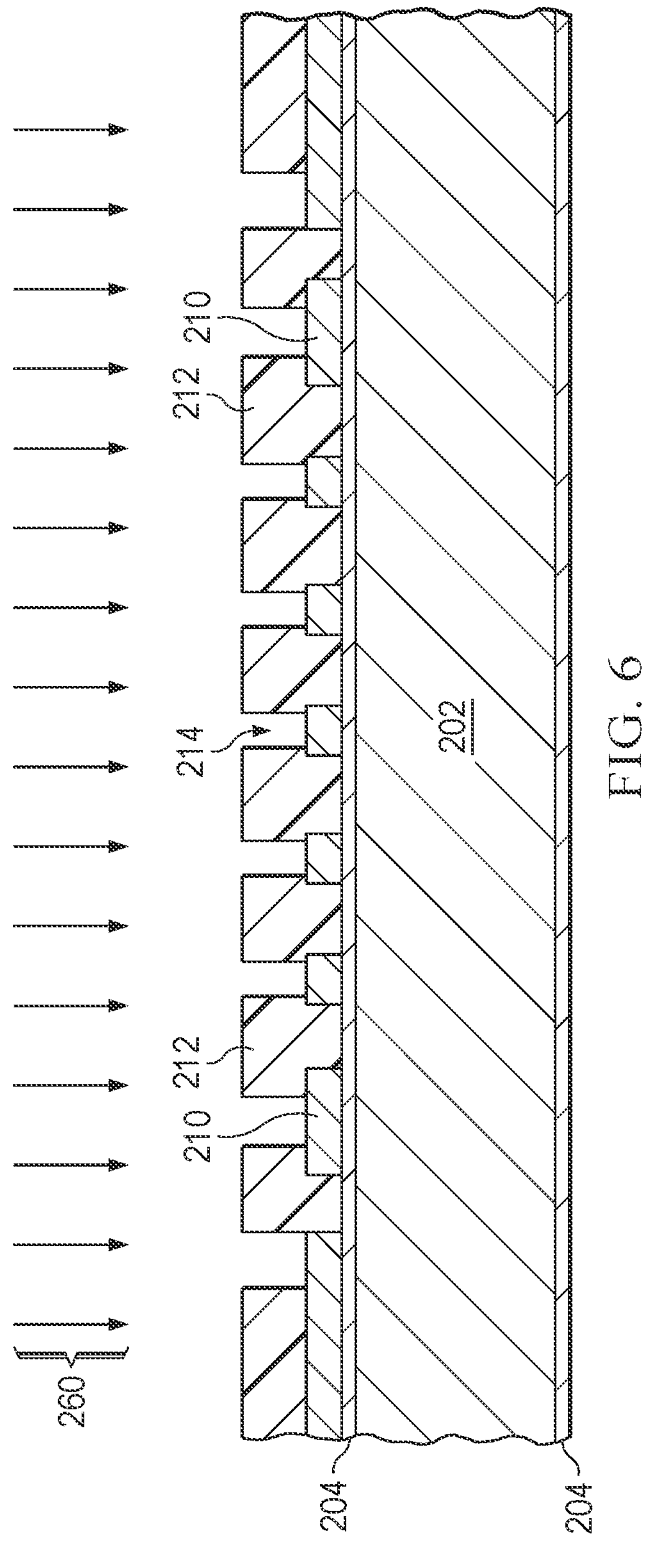
FIG. 6 illustrates a side view of the electronic device of FIG. 5 undergoing a second photoresist material layer patterning.
Figure 7:
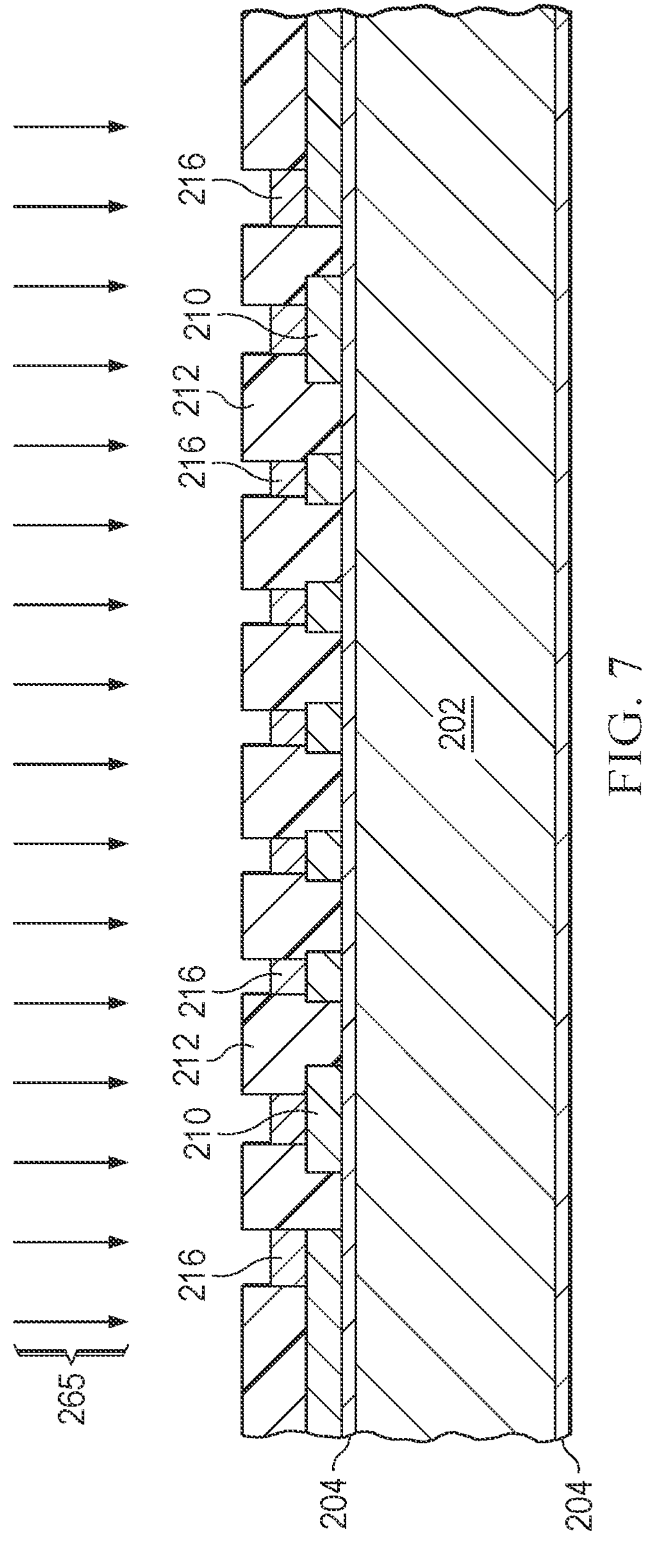
FIG. 7 illustrates a side view of the electronic device of FIG. 6 undergoing a second electroplating process.
Figure 8:
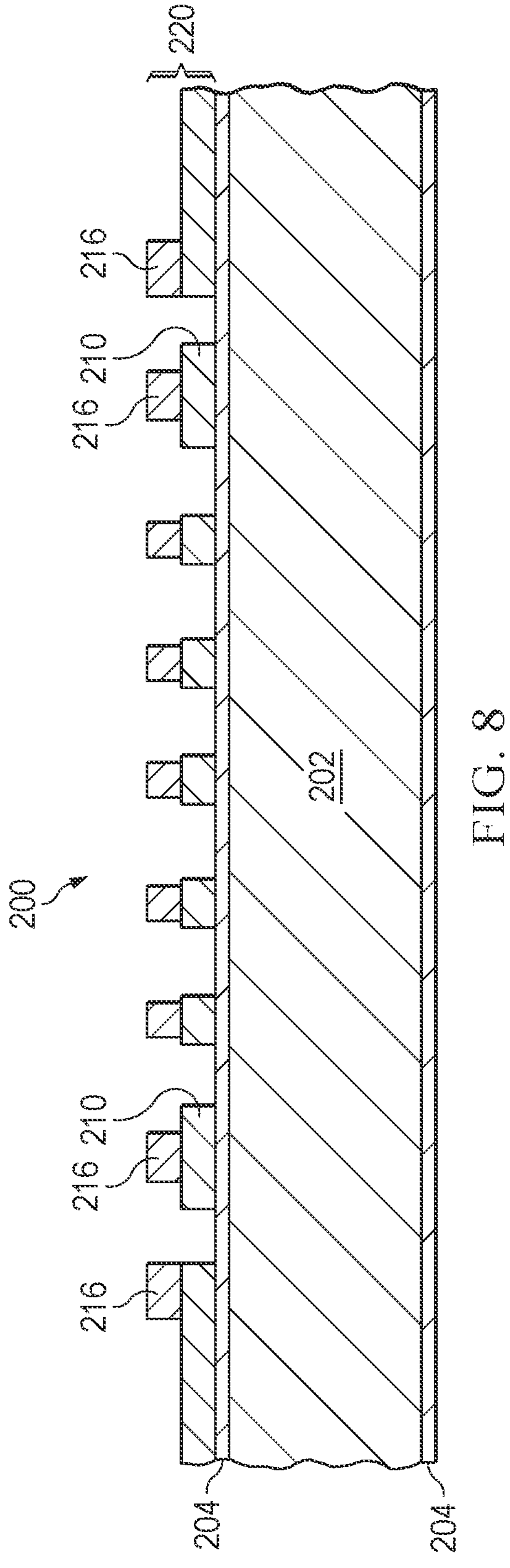
FIG. 8 illustrates a side view of the electronic device of FIG. 7 after undergoing an etch process and stripping of the second photoresist material layer.

Referring to FIG. 6, a second photoresist material layer 212 is deposited on the metal carrier layer 204 and on portions of the metal traces 210, and is patterned and developed to expose second openings 214 in the second photoresist material layer 212 in accordance with a pattern. Metal pillars (e.g., copper) 216 are deposited in the second openings 214 via a second electroplating process 260 on the metal traces 210 resulting in the configuration in FIG. 7. The second photoresist material layer 212 is stripped via a second etching process 265 resulting in the configuration in FIG. 8. The combination of the metal traces 210 and the metal pillars 216 together form a metal layer 220 of the electronic device 100A. Additional metal layers may be formed on the metal layer 220 based on the application of the electronic device 100A. Thus, the metal layer 220 would be a first metal layer 220 and any additional metal layers would be a second, a third, etc. metal layer.

Figure 9:
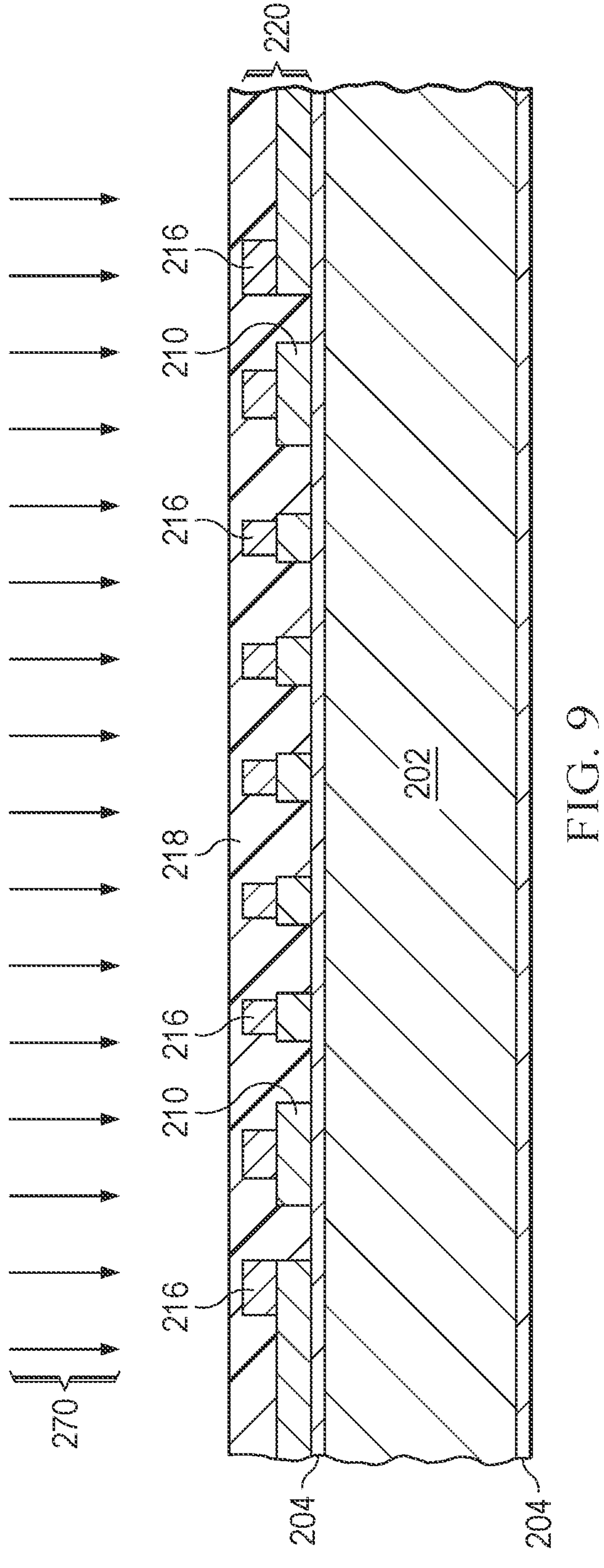
FIG. 9 illustrates a side view of the electronic device of FIG. 8 undergoing a third photoresist material layer patterning.
Figure 10:
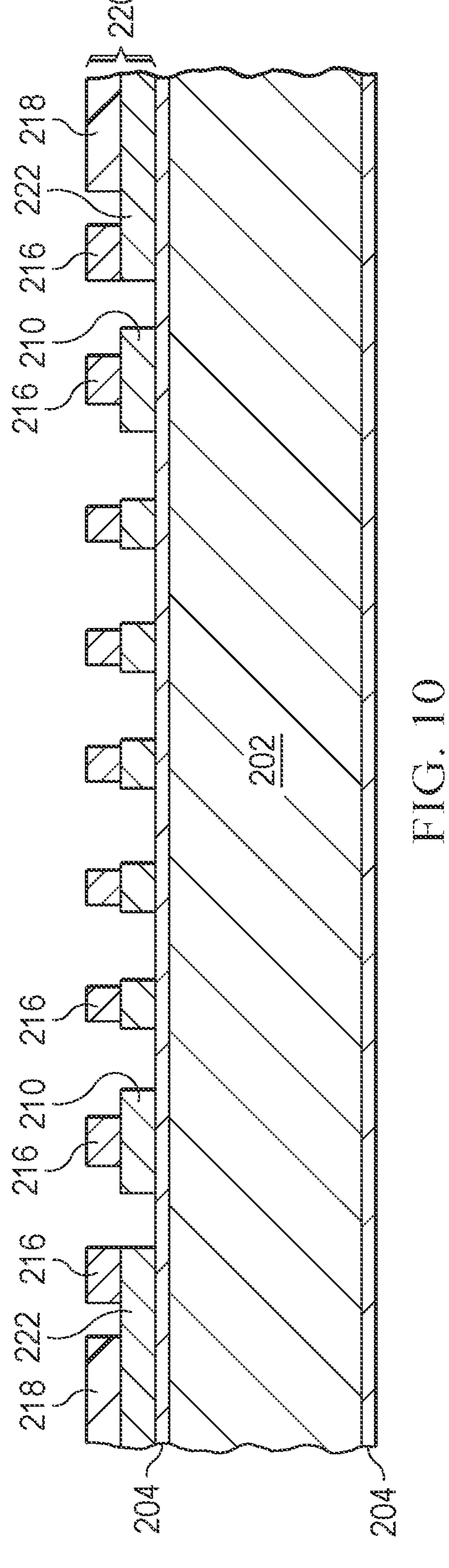
FIG. 10 illustrates a side view of the electronic device of FIG. 9 after undergoing an etch process and stripping of most but not all of the third photoresist material layer.
Figure 11:
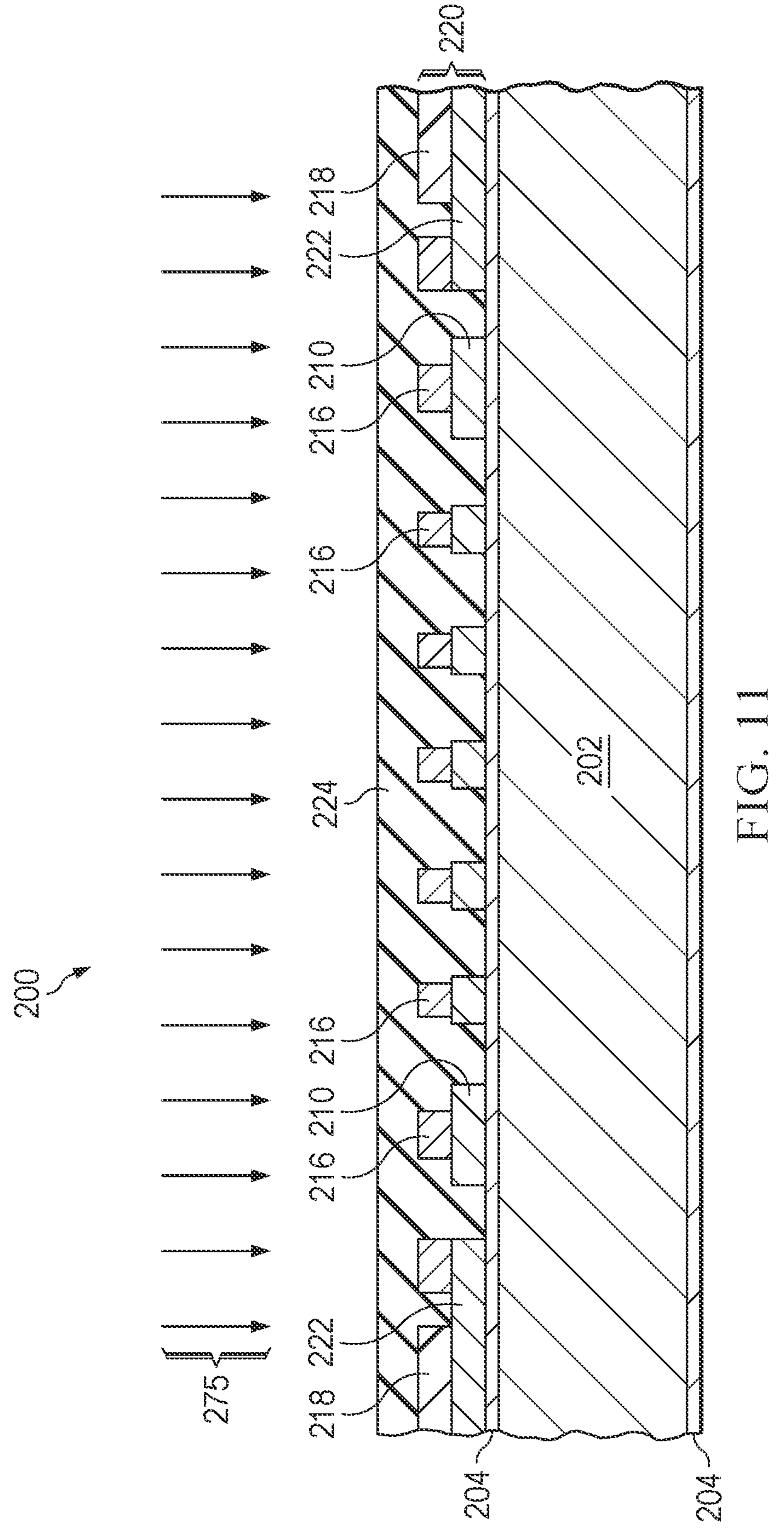
FIG. 11 illustrates a side view of the electronic device of FIG. 10 undergoing a formation of a dielectric layer over via a compression molding process.
Figure 12:
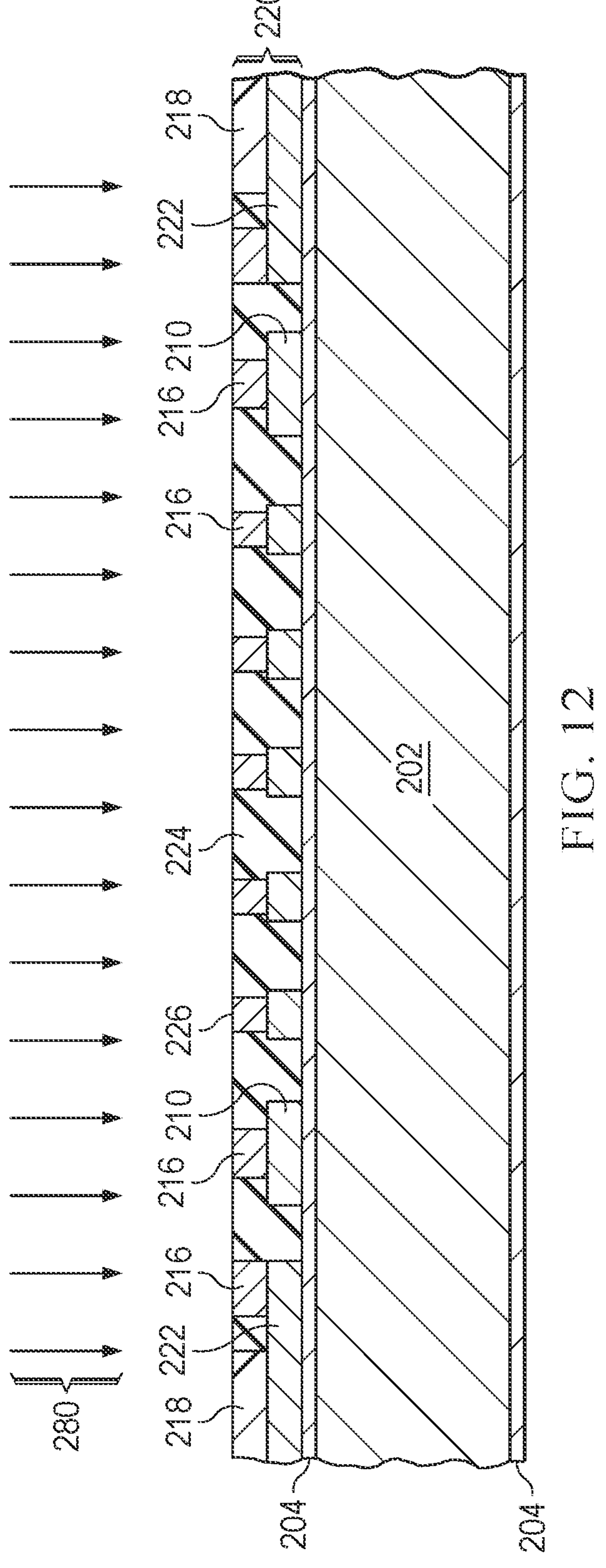
FIG. 12 illustrates a side view of the electronic device of FIG. 11 undergoing a grinding process to grind a portion of the dielectric layer.
Figure 13:
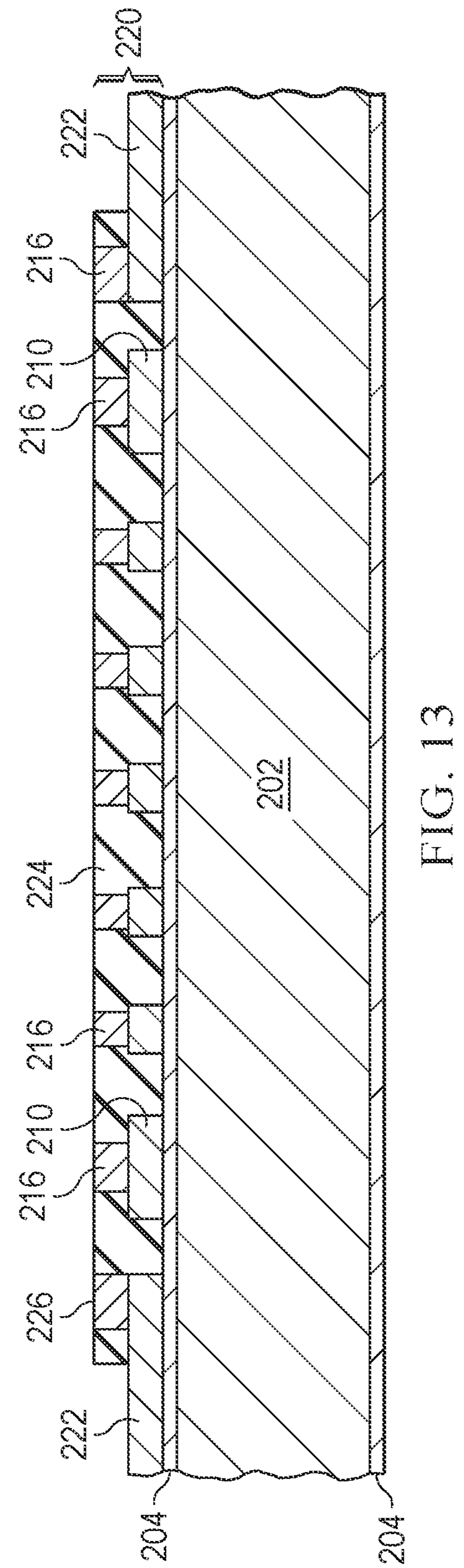
FIG. 13 illustrates a side view of the electronic device of FIG. 12 undergoing an etch process and stripping of the remaining portions of the third photoresist material layer

Referring to FIG. 9, a third photoresist material layer 218 is deposited over the metal carrier layer 204 and the metal layer 220. The third photoresist material layer 218 is patterned and developed 270 to expose all portions of the metal layer 220 with the exception of leads 222 on the sides of the metal layer 220 in accordance with a pattern resulting in the configuration in FIG. 10. The leads 222 may be formed on one, two, three, or all four sides of the metal layer 220 based on the application of the electronic device 100A. Referring to FIG. 11, an insulating film or a polymer dielectric layer (e.g., ABF laminate) 224 is formed over the metal layer 220 via a compression molding process thereby encapsulating the metal layer 220 and remaining portions of the third photoresist material layer 218 disposed on the leads 222 of the metal layer 220. A portion of the dielectric layer 224 is removed via a grinding process 275 thereby exposing surfaces 226 of the metal layer 220 and remaining portions of the third photoresist material layer 218 disposed on the leads 222 of the metal layer 220 resulting in the configuration in FIG. 12. The remaining portions of the third photoresist material layer 218 disposed on the leads 222 of the metal layer 220 is stripped via an etching process 280 resulting in the configuration in FIG. 13.

Figure 14:
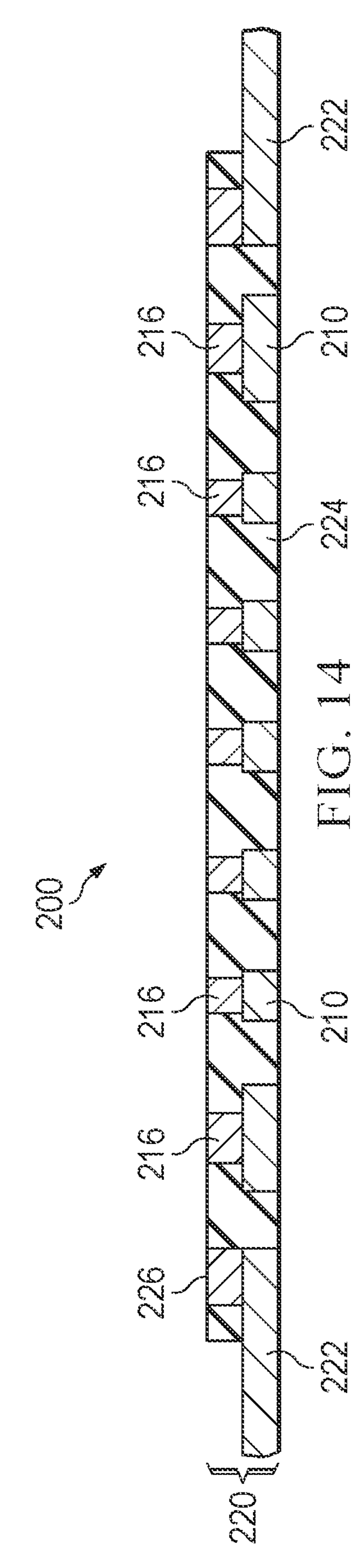
FIG. 14 illustrates a side view of the electronic device of FIG. 13 with metal carrier removed.
Figure 15:
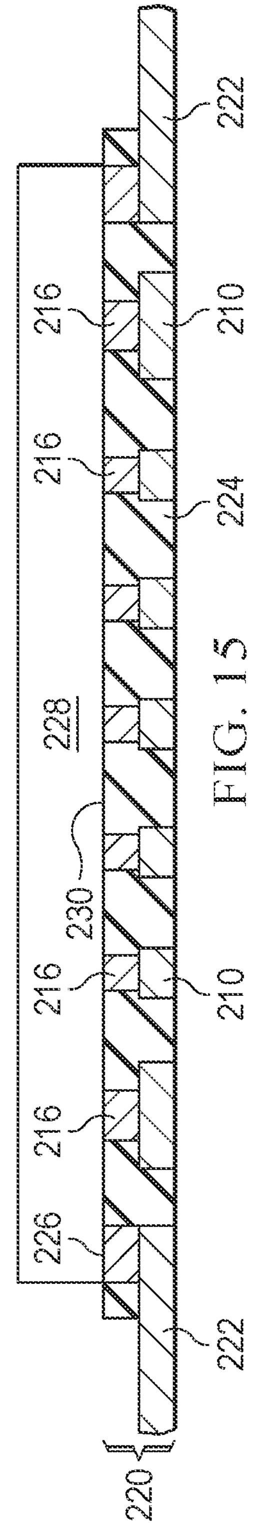
FIG. 15 illustrates a side view of the electronic device including a die attached to the dielectric layer.

The metal carrier 202 and the metal carrier layer 204 are removed or dislodged from the dielectric layer 224 and the metal layer 220 via a combination of a chemical etch process and a mechanical process resulting in the configuration in FIG. 14. Referring to FIG. 15, a die 228 is attached to a first (top) surface 230 of the dielectric layer 224. In one example, the die 228 includes exposed pins or contacts on a surface (attachment surface) that contacts the dielectric layer 224 such that the exposed pins or contacts align with the exposed surfaces 226 of the metal pillars 216 thereby forming an electrical connection between the die 228 and the metal layer 220. This example is similar to a flip-chip mounting method where solder is first deposited on the metal pillars 216 to form the connection between the exposed pins or contacts on the surface of the die 228 and the metal pillars 216. In this example, additional bonding wires may be attached from pins on an opposite surface of the die 228 that contacts the dielectric layer 224 to the metal traces 210 or leads 222 to form additional electrical connections (see FIG. 1B). In another example, the die 228 may not include the exposed pins or contacts on the attachment surface. In this example, the die 228 is attached to the top surface 230 of the dielectric layer 224 via a die attach epoxy. The die 228 is positioned such that the die attach epoxy does not contact the metal pillars 216. Bonding wires, as illustrated in FIG. 1B, are then attached from the pins on the opposite surface of the die 228 to the metal traces 210, the metal pillars, or leads the 222.

Figure 16:
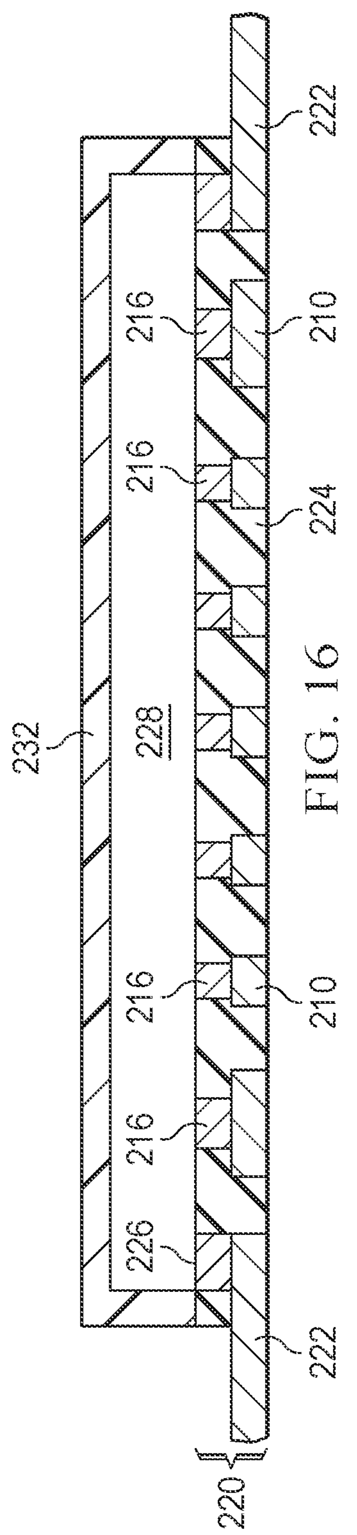
FIG. 16 illustrates a side view of the electronic device after formation of a mold compound.

A mold compound 232 encapsulates the die 228 and is formed over the metal layer 220 and the dielectric layer 224 and is cured during a curing process thereby forming the electronic device 100A illustrated in FIG. 16, The mold compound can be made from an epoxy or epoxy blends, silicone, polyimide, etc. The mold compound 232 is not formed over the leads 222 of the metal layer 220. Thus, the leads 222 are external leads as illustrated in the electronic device 100A, 100B in FIGS. 1A and 1B, for example as in a leaded IC package. The leads 222 may be shaped or formed such that the leads 222 can be bent in a direction away from the die 228 that facilitates an electrical attachment to a PCB via soldering. As mentioned above, the process disclosed herein applies to an array of IC packages. Thus, after fabrication of the IC packages the array is singulated to separate the IC packages from the array.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean based at least in part.

What is claimed is:

1. A method, comprising:

depositing a metal layer on a carrier, the metal layer comprising metal traces, metal pillars disposed on the metal traces, and leads;

patterning a photoresist material layer on the leads;

forming a dielectric layer over the metal layer, surfaces of the metal pillars being exposed from a first surface of the dielectric layer;

removing the photoresist material layer from the leads;

removing the carrier;

attaching a die to the first surface of the dielectric layer, the die including electrical contacts on a surface of the die that contacts the dielectric layer, the electrical contacts being aligned with and electrically connecting with the exposed surfaces of the metal pillars;

attaching a bonding wire from the die to at least one of the metal traces and/or at least one of the leads; and forming a mold compound over the die, the dielectric layer, and the metal layer, wherein surfaces of the metal traces are exposed from a second surface of the dielectric layer opposite the first surface and are not covered by the mold compound.

2. The method of claim 1, wherein depositing the metal layer on the carrier includes providing a metal carrier, patterning and developing a first photoresist material layer on the metal carrier to expose first openings in the first photoresist material layer, electroplating the metal traces on the metal carrier in the first openings of the first photoresist material layer, and stripping the first photoresist material layer via a first etching process.

3. The method of claim 2, wherein depositing the metal layer on the carrier further includes patterning and developing a second photoresist material layer on the metal carrier to expose second openings in the second photoresist material layer, electroplating the metal pillars on the metal traces in the second openings of the second photoresist material layer, and stripping the second photoresist material layer via a second etching process.

4. The method of claim 3, wherein patterning the photoresist material layer on the leads includes depositing a third photoresist material layer over the metal layer and patterning and developing the third photoresist material layer to expose all portions of the metal layer except portions of the leads.

5. The method of claim 4, wherein forming the dielectric layer over the metal layer includes compression molding the dielectric layer over the metal layer and grinding the dielectric layer to expose the surfaces of the metal pillars and to expose the third photoresist material layer.

6. The method of claim 5, wherein removing the photoresist material layer from the leads includes stripping the third photoresist material layer via a third etching process.

7. The method of claim 1, wherein removing the carrier includes dislodging the carrier from the dielectric layer and the metal layer via a chemical etch process and a mechanical process.

8. The method of claim 1, further comprising bending the leads in a direction away from the die to facilitate connection to a circuit board.

9. A method of fabricating an integrated circuit, the method comprising:

providing a metal carrier, the metal carrier having a metal carrier layer deposited on a surface of the metal carrier;

depositing a metal layer on the metal carrier layer, the metal layer comprising metal traces, metal pillars disposed on the metal traces, and leads;

patterning a photoresist material layer on the leads;

forming a dielectric layer over the metal layer, surfaces of the metal pillars being exposed from a first surface of the dielectric layer;

removing the photoresist material layer from the leads;

removing the metal carrier;

attaching a die to the first surface of the dielectric layer, the die including electrical contacts on a surface of the die that contacts the dielectric layer, the electrical contacts being aligned with and electrically connecting with the exposed surfaces of the metal pillars;

attaching a bonding wire from the die to at least one of the metal traces and/or at least one of the leads;

forming a mold compound over the die, the dielectric layer, and the metal layer; and bending the leads in a direction away from the die to facilitate connection to a circuit board, wherein surfaces of the metal traces are exposed from a second surface of the dielectric layer opposite the first surface and are not covered by the mold compound.

10. The method of claim 9, wherein depositing the metal layer on the metal carrier layer includes patterning and developing a first photoresist material layer on the metal carrier layer to expose first openings in the first photoresist material layer, electroplating the metal traces on the metal carrier layer in the first openings of the first photoresist material layer, and stripping the first photoresist material layer via a first etching process.

11. The method of claim 10, wherein depositing the metal layer on the metal carrier layer further includes patterning and developing a second photoresist material layer on the metal carrier layer to expose second openings in the second photoresist material layer, electroplating the metal pillars on the metal traces in the second openings of the second photoresist material layer, and stripping the second photoresist material layer via a second etching process.

12. The method of claim 11, wherein patterning the photoresist material layer on the leads includes depositing a third photoresist material layer over the metal layer and patterning and developing the third photoresist material layer to expose all portions of the metal layer except portions of the leads.

13. The method of claim 12, wherein forming the dielectric layer over the metal layer includes compression molding the dielectric layer over the metal layer and grinding the dielectric layer to expose the surfaces of the metal pillars and to expose the third photoresist material layer.

14. The method of claim 13, wherein removing the photoresist material layer from the leads includes stripping the third photoresist material layer via a third etching process.

15. An electronic device, comprising:

a dielectric layer;

a metal layer embedded in the dielectric layer, the metal layer including leads, metal traces, and metal pillars, surfaces of the metal pillars being exposed from a first surface of the dielectric layer;

a die attached to the first surface of the dielectric layer, the die including electrical contacts on a first surface of the die that contacts the dielectric layer, the electrical contacts being aligned with and electrically connecting with the exposed surfaces of the metal pillars;

bonding wires that extend from pins on a second surface of the die opposite the first surface that contacts the dielectric layer to at least one of the metal traces and/or at least one of the leads; and a mold compound over the dielectric layer, the metal layer, and the die, wherein surfaces of the metal traces are exposed from a second surface of the dielectric layer opposite the first surface and are not covered by the mold compound.

16. The electronic device of claim 15, wherein the leads are bended in a direction that facilitates a connection to a circuit board.

17. The electronic device of claim 15, wherein the metal pillars are disposed on the metal traces.

* * * * *